United States Patent [19]
Freund et al.

[11] Patent Number: 5,187,442
[45] Date of Patent: * Feb. 16, 1993

[54] METHOD AND APPARATUS FOR CHARGE DISTRIBUTION ANALYSIS

[76] Inventors: Friedemann Freund, 225 Sussex St., San Francisco, Calif. 94131; Francois Batllo, 1505 De Rose Way #51, San Jose, Calif. 95126; Minoru M. Freund, 225 Sussex St., San Francisco, Calif. 94131

[*] Notice: The portion of the term of this patent subsequent to Nov. 28, 2006 has been disclaimed.

[21] Appl. No.: 768,343

[22] PCT Filed: Sep. 29, 1989

[86] PCT No.: PCT/US89/04272
§ 371 Date: Nov. 28, 1989
§ 102(e) Date: Nov. 28, 1989

Related U.S. Application Data

[63] Continuation of Ser. No. 499,323, Nov. 28, 1989, abandoned.

[51] Int. Cl.$^5$ .......................................... G01N 27/60
[52] U.S. Cl. .................................. 324/452; 324/457; 324/72; 177/210 EM
[58] Field of Search ............... 324/452, 457, 459, 464, 324/72, 98; 73/862.68; 177/210 EM

[56] References Cited

U.S. PATENT DOCUMENTS

| | | | |
|---|---|---|---|
| 2,661,456 | 12/1953 | Bosch | 324/109 |
| 2,734,735 | 2/1956 | Payne . | |
| 3,106,978 | 10/1963 | Cahn . | |
| 3,234,462 | 2/1966 | Holdsworth . | |
| 3,443,224 | 5/1969 | Kramer et al. | 324/72.5 |
| 3,652,932 | 3/1972 | Sessler et al. . | |
| 3,824,454 | 7/1974 | Stern et al. | 324/457 |
| 4,370,616 | 1/1983 | Williams . | |
| 4,553,089 | 11/1985 | Lewiner et al. . | |
| 4,673,885 | 7/1987 | Lewiner et al. | 324/457 |
| 4,884,031 | 11/1989 | Freund et al. | 324/457 |
| 4,973,910 | 11/1990 | Wilson | 324/457 |

FOREIGN PATENT DOCUMENTS

| | | |
|---|---|---|
| 372781 | 4/1923 | Fed. Rep. of Germany . |
| 2549232 | 1/1985 | France .................. 324/457 |

(List continued on next page.)

OTHER PUBLICATIONS

Lehovec, (1953) *J. Chem. Phys.* 21(7):1123-1128.
Kliewer et al., (1965) *Phys. Rev.* 140(4A):1226-1246.

(List continued on next page.)

*Primary Examiner*—Jack B. Harvey
*Assistant Examiner*—Maura K. Regan
*Attorney, Agent, or Firm*—Reed & Robins

[57] ABSTRACT

Method and apparatus of charge distribution analysis insulating and semiconducting dielectric materials to measure by using a Coulomb Balance surface/subsurface space charge layers and the sign, mobility and polarizability of charge carriers. The technique includes measuring the force, attractive or repellent, between a bias electrode to which a voltage is applied and a dielectric material in a condensor half cell arrangement. An apparatus is provided for heating a sample for causing the generation of surface/subsurface charges, and then for applying an external potential while the sample is maintained at a high temperature. The effective mass of the sample is detected by determining the amount of force necessary to restore a balance arm, by which the sample is supported, to its original position, the alteration in position being due to attractive or repulsive electrostatic forces between the sample and the electrodes. The effective mass reflects the amount of peroxies or impurities within the sample, and the method and apparatus may be used for scientific mineral composition analysis, quality control of the purity of semiconductors, and in other applications. The heating of the sample may by a combination of any of conductive, convective and radiative means. In a preferred embodiment, the sample is supported on a vertically-disposed beam.

6 Claims, 12 Drawing Sheets

FOREIGN PATENT DOCUMENTS

| | | | |
|---|---|---|---|
| 119064 | 9/1980 | Japan | 324/457 |
| 649183 | 2/1979 | U.S.S.R. | |
| 900221 | 1/1982 | U.S.S.R. | |
| 995016 | 2/1983 | U.S.S.R. | |
| 1046714 | 10/1983 | U.S.S.R. | |
| 1247781 | 7/1986 | U.S.S.R. | |
| 1262421 | 10/1986 | U.S.S.R. | |
| 1390578 | 4/1988 | U.S.S.R. | 324/457 |

OTHER PUBLICATIONS

Kingery, (1974) *J. Am. Ceram. Soc.* 57(2):74–83.
King et al., (1984) *Physical Review* B29(10):5814–5824.
Freund, (1985) *Journal of Non-Crystalline Solids* 71:195–202.
Product Descriptions in Performance Specifications (Apr. 1, 1988), pp. 1–11.
Perkin-Elmer Corporation, "Instructions for TGS-1 Thermobalance," 1967, pp. 1-1 through 8-1.

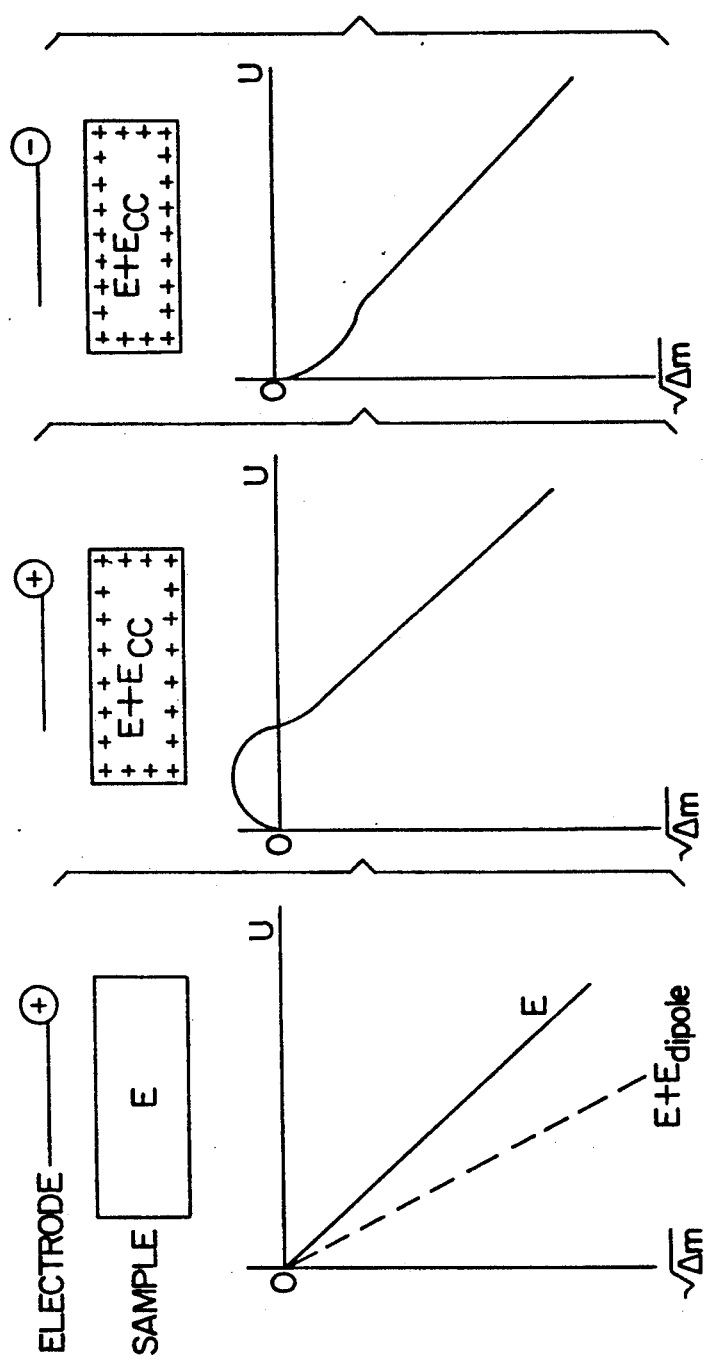

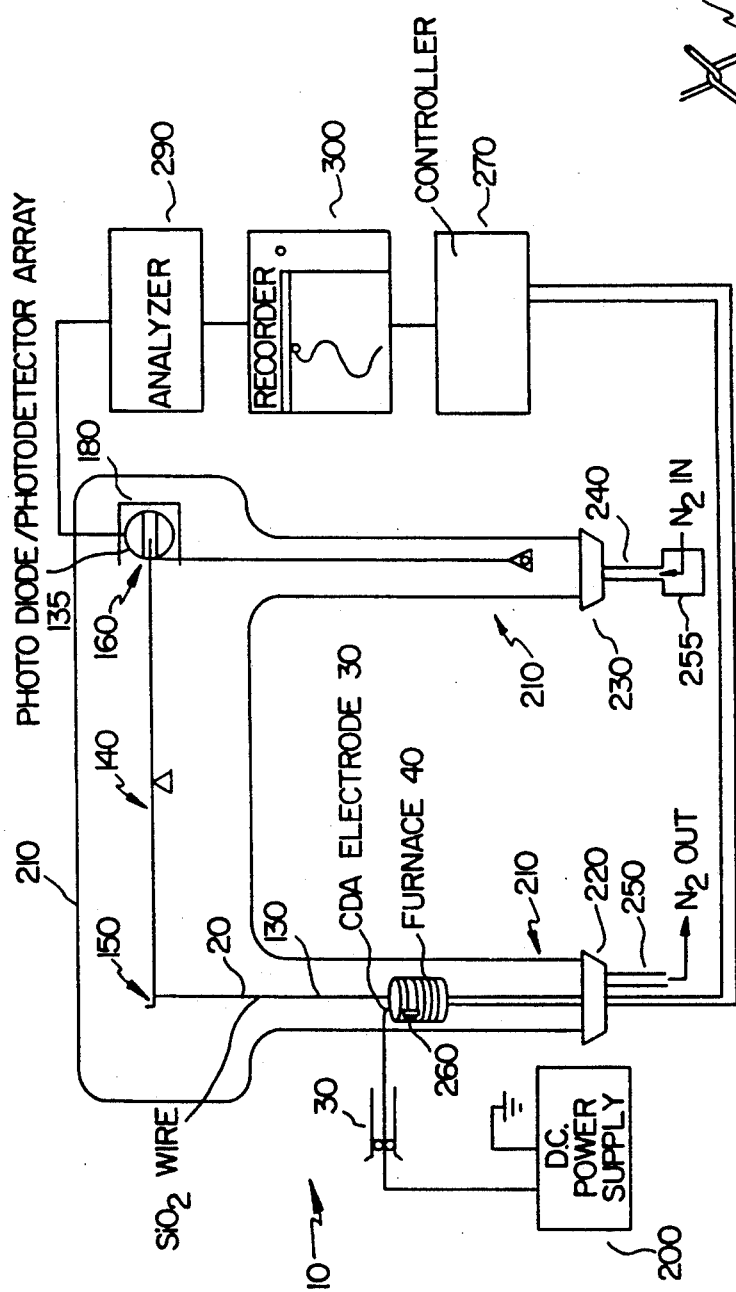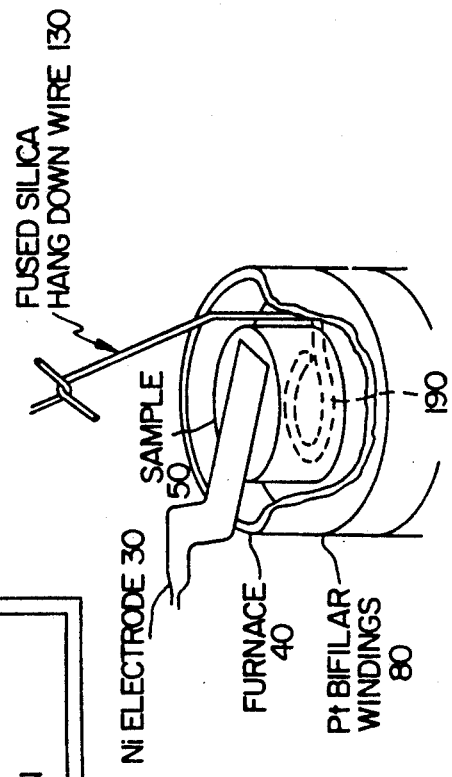
FIG. 4
FIG. 4A

METHOD AND APPARATUS FOR CHARGE DISTRIBUTION ANALYSIS

This application is a continuation of application Ser. No. 07/499,323, filed Nov. 28, 1989, now abandoned.

BACKGROUND OF THE INVENTION

The present invention is directed to a new apparatus and method of charge distribution analysis, or CDA, to measure surface and/or subsurface charge layers, the sign of dominant charge carriers, and their mobility in—as well as the dielectric constant of—insulating and semiconducting dielectric materials.

The existence of surface/subsurface charge layers has been theoretically predicted on the basis of fundamental thermodynamic laws, specifically for ionic insulators. For instance, discussions of such charge layers may be found in the following articles: K. Lehovec, J. Chem. Phys. 21, 1123 (1953); K. L. Kliewer and J. S. Koehler, Phys. Rev. 140A, 1226 (1965); and W. D. Kingery, J.Am. Ceram. Soc. 57, 1 (1974) and 57, 74 (1974). A discussion of oxide insulators with electronic defects is found in the article by B. V. King and F. Freund, Phys. Rev B29, 5814 (1984). The presence of such charge layers has been concluded from a variety of indirect observations such as the preferred segregation of certain aliovalent cations to surfaces and/or grain boundaries (Kingery 1974 articles cited above), the deflection of low energy electron or ion beams from surfaces, the energy dispersion of photoelectrons emitted from surfaces and many manifestations of electrostatic adhesion. Each of the above references is hereby incorporated herein by reference.

However, no method has existed until now for directly measuring and quantifying surface/subsurface charge layers, and for determining the sign and mobility of the dominant charge carriers.

Prior methods such as the measurement of cation surface or grain boundary segregation in ceramics are indirect and limited to high temperatures. They require thermal pretreatment of the samples, extensive sample preparation for observation of frozen-in disequilibrium states by microanalytical techniques (Kingery 1974) or extremely clean surface conditions in ultrahigh vacuum. Prior methods such as the deflection or energy dispersion of low energy charged beams, both electrons and other particles, inherently require high or ultrahigh vacua, and are restricted to very thin surface/subsurface layers due to the limited depth of penetration or escape depth of low energy electron or ion beams.

Prior methods such as based on electrostatic adhesion are qualitative at best, giving no or very limited information about the strength of the effect, about the concentration and the nature of the dominant charge carriers.

SUMMARY OF THE INVENTION

It is an object of this invention to provide a method for charge distribution analysis, or CDA, for measuring surface/subsurface charge layers, and for determining the sign of the dominant charge carriers and their mobility in insulating and semiconducting dielectric materials.

It is a further object of this invention to utilize as a force sensor an electronic force-sensitive device or a balance, appropriately called a Coulomb Balance, to measure the force between a dielectric material carrying a surface/subsurface charge layer and a bias electrode at close proximity to which a voltage may be applied.

It is still another object of this invention to measure this force as a function of various physical parameters including, but not limited to, the sign of the applied voltage, the magnitude of the applied voltage, sample position, sample temperature, photon flux, phonon (sound wave) flux, electron bombardment and particle bombardment.

It is a further object of this invention to provide a method for measuring the magnetic susceptibilities of materials independent of mass losses or mass gains of these materials during measurement.

It is a further object of this invention to provide a method for measuring simultaneously, within the same apparatus, dielectric and magnetic susceptibilities and derivative properties of materials independent of mass losses or mass gains during measurement.

It is a further object of this invention to utilize a vertical pendulum with its axis z set parallel to the prevailing gravitational vector g, with forcesensitive devices or transmittors attached to the pendulum to measure forces acting in the xy plane perpendicular to the g vector.

It is an additional object of this invention to utilize for the measurement of the said forces a vertical pendulum with the sample loaded below the center of gravity.

It is an additional object of this invention to utilize for the measurement of the said forces a vertical pendulum with the sample loaded above the center of gravity.

It is yet another object of this invention to measure the said force in a static mode.

It is yet another object of this invention to measure the said force in a dynamic mode.

It is an additional object of this invention to utilize for the measurement of said force a horizontal beam balance with top-loading or direct loading on the beam.

It is a further object of this invention to utilize for the measurement of said force a horizontal beam balance with bottom-loading via a hang-down wire.

It is also an object of this invention to utilize for the measurement of said force a torsion balance.

It is an additional object of this invention to utilize for the measurement of said force an electronic force-sensitive device including but not limited to position-sensitive or pressure-sensitive or tension-sensitive devices.

BRIEF DESCRIPTION OF THE DRAWINGS

FIG. 2A and 2B show responses to applied electric fields of, respectively, an ideal dielectric material and a dielectric material with charge carriers of a certain mobility.

FIG. 4 shows an apparatus according to the present invention.

FIG. 4A shows an enlarged view, partially cut away, of a portion of an apparatus according to the invention.

DETAILED DESCRIPTION OF THE INVENTION

Figure 1:
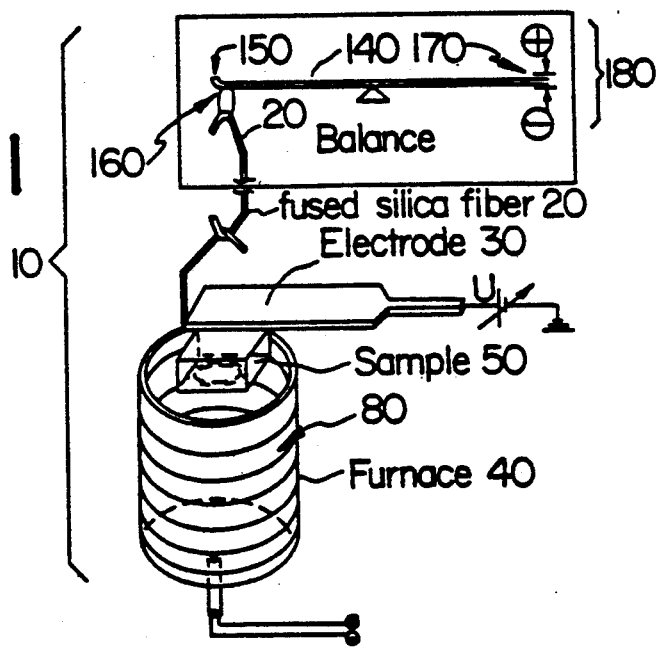
FIG. 1 shows a charge distribution analysis apparatus according to the present invention.
Figure 3A:
FIGS. 3A-3D show force measurements due to charge mobility for four limiting cases of charge distribution.
Figure 3B:
Figure 3C:
Figure 3D:
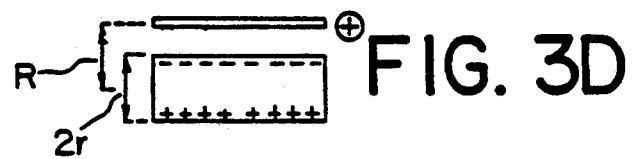

Turning now to the drawings, more particularly to FIG. 1, there is shown, in accordance with the invention, an example of a Coulomb Balance for charge distribution analysis using a conventional bottom-loading balance 10, such as the TGS Thermobalance produced by Perkin-Elmer, which is marked with U.S. Pat. No. 3,140,097, which is incorporated herein by reference. In the present invention, a hang-down wire 20 is utilized in conjunction with the balance 10, and a bias electrode 30 is also used, to which a positive or negative voltage can be applied. A grounded furnace 40 is used to vary the temperature of the sample 50. The sample 50 preferably has a flat, polished surface 60, and is suspended in such a manner as to be fully insulated from ground. The wire 20 may be of silicon dioxide ($SiO_2$) In the preferred embodiment, the electrode 30 is of nickel.

Figure 5:
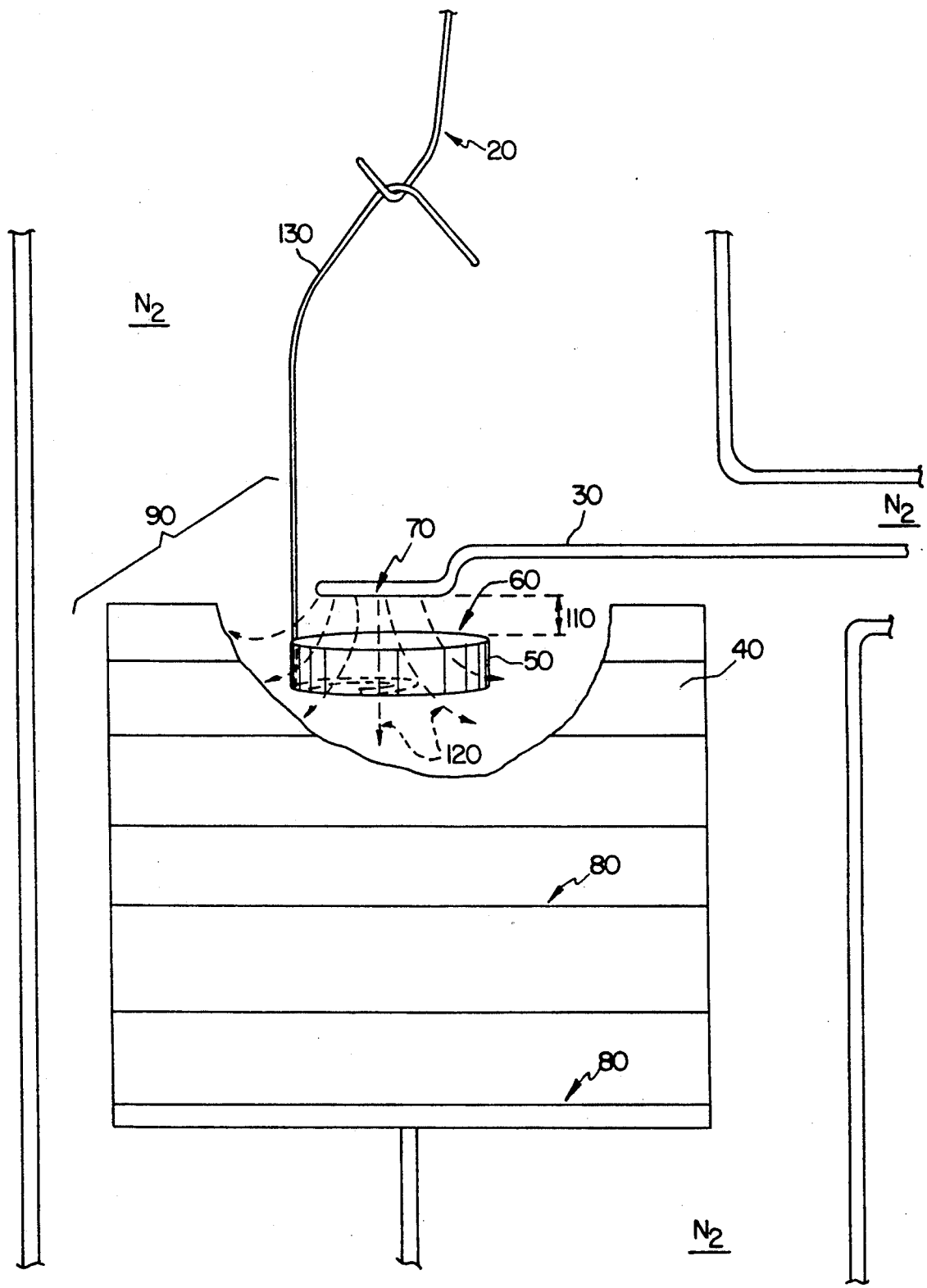
FIG. 5 shows an enlarged view of a portion of a device according to the present invention.

As shown in FIG. 5, the electrode 30 preferably has a flat portion 70 which is substantially parallel to the flat surface 60 and is positioned a predetermined distance above the sample 50.

The electrode/sample arrangement to be used in CDA and exemplified in the insert in FIG. 1 is that of a capacitor half cell where the sample is placed in an nonhomogeneous electric field. The bias electrode 30 forms one electrode of a capacitor, and is carried by an insulated support 100. As shown schematically in FIGS. 1 and 4, the electrode 30 is connected to an electrical biasing circuit.

The furnace 40 is preferably formed from ceramic, and has windings 80 embedded therein, with the windings 80 defining the counterelectrode for the capacitor 90. Thus, the sample 50, being positioned between the electrode 30 and the windings 80, acts as a dielectric for the capacitor 90. The windings 80 are typically of platinum.

Other forms of electrodes than shown as the example in FIGS. 1 and 5 may be used in accordance with the invention, including but not limited to wedge-shaped or needle-shaped electrodes or 1-dimensional or 2-dimensional electrode arrays, and other types of force-measuring devices. Also other force measuring devices than the balance shown as an example in FIG. 1 may be used in accordance with the invention allowing to arrange the bias electrode differently, to substitute the furnace by or to combine it with a cooling jacket, or to replace it by a radiation-heating device and to add access ports or openings for additional instrumentation.

Both the sample 50 and the electrode-bearing device, while being at ground potential or any chosen positive or negative potential, be electrically as highly insulated as possible.

The gap or distance 110 (shown in FIG. 5) between the sample 50 and the bias electrode 30 to which a positive or negative potential may be applied, is preferably smaller than the distance to any equipotential surface by which a counterelectrode may be defined. In addition, the gap 110 should be smaller than, or of the same order of magnitude as, the thickness of the sample measured in the direction of the electric field lines, such as field lines 120 shown in FIG. 5. In the configuration of FIG. 5, this means that the gap should be less than approximately the thickness of the sample 50 measured in the vertical direction from the point of view of that Figure.

The following discussion is of a theory which applicants believe explain the operation of the present invention. Following the theoretical discussion is the discussion of the actual operation of the invention and its method of use.

THEORY

Evaluating the Maxwell equations one can deduce the force F acting on a dielectric in an electric external field $E_0$:

$$F = -\int_V (P \cdot grad) E_0 dV \quad (1)$$

where P is the polarization of the dielectric and $E_0$ is the external applied field in the absence of the dielectric. The integral is to be taken over some volume fully enclosing the dielectric body, but without the sources of the field. If the medium is an ideal dielectric, the relation $$P = \frac{\epsilon - 1}{4\pi} E_0$$

holds. Inserting this into equation 1 and using the fact that $\nabla \cdot E_0 = 0$ we find:

$$F = -\frac{\epsilon - 1}{4\pi} \int_V E_0 (V \cdot E_0) dV \quad (2)$$

Since the electric field $E_0$ is proportional to the potential difference U of the electrodes, $F \sim U^2$ or $U \sim \sqrt{|F|}$, the slope of U versus $\sqrt{|F|}$ is proportional to $\sqrt{\epsilon - 1}$.

From equation 2 we also see that F vanishes in a constant electric field. To exert a force on the dielectric an nonhomogeneous electric field is therefore essential. At the same time a change in the polarity of $E_0$ should leave F invariant, which is not observed experimentally. It may also be noted that the strikingly different behavior the $\sqrt{F}$ vs·$\mu$ curve under positive and negative bias cannot be due to temperature gradients, since when evaluating the force F one finds a term $F_T \sim E_o^2$ grad T. Since this term is quadratic in $E_0$, it is invariant under changes of the polarity of $E_0$.

In order to explain the behavior of the dielectric in an nonhomogeneous electric field we must assume additional second order terms in P which may be of the form:

$$P = P_0 - \frac{\epsilon - 1}{4\pi} E_0 \quad (3)$$

In principle both the applied external field $E_0$ and P can be calculated:

The applied external electric field is given by $E_0 = -$ grad $\phi_0$, where $\phi_0$ is the scalar potential. $\phi_0$ depends only the geometry of the conductors and must be a solution of the Laplace equation $\Delta\phi_0 = 0$ using appropriate boundary conditions. In order to calculate P we first note that the electric induction D is defined by $D = E + 4\pi P$. P satisfies Maxwell's equation div $P = -p$, where p is the induced volume charge. The total charge in the body vanishes, $\int p dV = 0$, but note that $\int p r dV = \int P dV$ is the total dipole moment of the dielectric body. After making a microscopic model of P, the dielectric constant and the scalar potential $\phi_0$, must satisfy a set of two equations:

a) $\alpha\phi = 0$ and b) grad □ grad $\phi = 0$, where we have used that $E = -$grad $\phi$ and divD = div$\epsilon$E = $-$div($\epsilon$ grad $\phi$) = 0. If the dielectric body is homogeneous, grad $\epsilon = 0$ which reduces the problem to solving $\Delta \phi = 0$.

With a known geometry, the dielectric constant $\epsilon$ of the sample may be determined as follows. (Note that in the following discussion, the polarization P is defined slightly differently, so as to include the four contributors P1, P2, P3 and P4.)

When a dielectric material is placed in an external electric field of field strength $E_{ext}$, it becomes polarized and its polarization P is given by:

$$P = \frac{\epsilon_0 (\epsilon - 1)}{4\pi} E_{ext} \qquad (4)$$

where $\epsilon_0$ is the permittivity of vacuum, $\epsilon$ is the dielectric constant and $(\epsilon - 1)$ the dielectric susceptibility $\chi_{diel}$. P contains at least four contributions, P = P1 + P2 + P3 + P4, which denote, respectively, (1) those from the ideal dielectric due to the deformation of electron clouds and the relative displacements of nuclei, (2) those from local dipoles which may rotate but not diffuse, (3) those from mobile charges which can diffuse over macroscopic distances, and (4) those from surface charges.

By placing a dielectric in a static inhomogeneous electric field (with a field gradient along the z direction) we generate a force $F_z$ which causes an attraction towards the region of higher electric field density. The force $F_z^\pm = F_z(\pm E_{ext})$ can be calculated by evaluating the Maxwell equations:

$$F_z^\pm = -\int (P \cdot \nabla) E_{ext} dV \qquad (5)$$

where the integral is to be taken over the volume V which includes the sample but not the sources of the field. For dielectrics with only P1, P2 and P3 contributions $F_z^\pm \propto (\epsilon - 1)$, using Eq. (4). Since $E_{ext}$ is proportional to the potential difference U between the electrodes, $F_z^\pm \propto U^2$. By contrast, P4 contributions cause the dielectric to be either attracted to or repelled from the region of higher electric field density, depending upon the sign of the surface charge and polarity of the field. Contributions from P1, P2, P3 and P4 can be separated by forming the linear combinations $F^+ + F^-$ and $F^+ - F^-$ respectively:

$$F_\Sigma = \frac{1}{2}(F^+ + F^+) = -\frac{\epsilon_0 (\epsilon - 1)}{4\pi} \int_V \nabla \cdot E_{ext}^2 dV \qquad (6)$$

$$F_\Delta = \frac{1}{2}(F^+ - F^+) = -\int_V (P_3 \cdot \nabla) E_{ext} dV \qquad (7)$$

$F_\Sigma$ is used to give information about the dielectric constant $\epsilon$. $F_\Delta$ is used to calculate the surface charge density, and its sign unambiguously determines the sign of the majority charge carriers at the surface. In order to calculate the surface charge density, we place two dipole layers at both surfaces perpendicular to the z-direction of a crystal, assuming a cylindrical geometry for the sample, and neglect all charges on the sides of the cylinder. Using the fact that $E_{ext}$ only depends on the geometry $F_\Delta$ is given by:

$$F_\Delta = \qquad (8)$$

-continued $$8\pi^2 \epsilon_0 U(N \cdot e) \frac{D^2}{a^2} \sum_{n=1}^{\infty} \beta_n \left[ \int_0^b \rho J_0(k_{0n}\rho) d\rho \right] [\cosh(k_{0n} g) -$$

$$\cosh(k_{0n}(g+c))] \text{ where}$$

$$\beta_n = k_{0n} \frac{\cosech(k_{0n} L)}{J_1(k_{0n} a)} \left[ \int_0^d \rho J_0(k_{0n}\rho) d\rho \right],$$

where D is the dipole layer thickness, 2a the diameter of the counter electrode (which in this analysis is cylindrical), 2b the diameter of the sample, c the sample thickness, 2d the diameter of bias electrode which is disc-shaped, L the length of cylindrical counter electrode, g the distance from the sample surface to the bias electrode, N the number of electric charge carriers per unit area, e the electric charge of the carriers and $\epsilon_0$ the permittivity of vacuum. $J_n$ are the Bessel functions of n-th order, where $k_{0n} = x_{0n}/a$, with $x_{0n}$ being the solutions of the zero order Bessel function $J_0(x_{0n}) = 0$. Taking into account both the errors made by the approximations it is estimated that the calculated surface charge density should be correct to within one order of magnitude.

Because $F^+$ and $F^-$ are measured, and $E_{ext}$ is also known (being applied by the user), and the gradient of the electric field is known from the geometry of the apparatus, the only remaining variable is $\epsilon$, which can therefore be calculated. If the geometry of the apparatus is standardized, then the electric field gradient is a constant for each measurement made, simplifying the calculations.

As mentioned above, P4 represents the contribution to polarization from surface charges, and can be determined from equation (7).

From equation (8), the surface charge density (N·e) is determined, since all of the other parameters are known.

Of particular interest to CDA are the cases where the charges consist of dissociated charge carriers of finite mobility and a spatial distribution within the sample which is initially non-uniform, due to either frozen-in disequilibrium states or to the existence of thermodynamically controlled surface/subsurface space charge layers.

In FIGS. 2A-2C there are shown schematically three cases of interest used here to illustrate the response of a dielectric material to an nonhomogeneous electric field expressed as square root of the force $(|F|)^{\frac{1}{2}}$ versus the applied bias voltage U. FIG. 2A represents an example of an ideal dielectric in which an nonhomogeneous electric field generates a straight line passing through the origin with a slope proportional to $(\epsilon - 1)^{\frac{1}{2}}$. FIG. 2B represents a dielectric with a dielectric constant $\Xi = 1$ with q charge carriers of mobility $\mu$[mu], and with a positive surface charge with a positive bias voltage generating at first a repulsion between sample and electrode, followed by an attraction which leads to a straight line not passing through the origin. FIG. 2C represents the analogous case for a negative bias voltage and the corresponding response of the sample characterized by an enhancement of the attractive force not passing through the origin. The simplified geometry depicted in FIGS. 2-2C is for the sake of illustration only and may be modified according to the other possible sample/electrode arrangements cited in this patent disclosure.

OPERATION

Measurement of the attractive and repulsive force due to the presence of charge carriers and possible non-uniform distribution of charge carriers under negative and/or positive bias allows the derivation of information about the nature of the charges in the sample, about their sign, concentration, spatial distribution, mobility and relaxation times. Likewise, information can be derived about the dielectric constant, its dependence on the various parameters, and about dipole or higher pole relaxation processes, though such information ma also be obtained by conventional impedance measurements in symmetrical condensor arrangements, e.g., without the special features of the CDA half cell arrangement which is described in this patent disclosure.

Referring now to FIGS. 4, 4A and 5, the apparatus shown therein si utilized int he following manner. A sample, such as a sample of olivine, obsidian, silica, or some other material, is configured and polished to have a flat surface, such as sample 50 with surface 60. The sample is placed upon a support 190, which may be simply a coil of the wire 130. The wire 130 is preferably of fused silica.

A D.C. power supply 200 is electrically connected t the windings 80, and is used to energize the windings so as to heat the furnace 40 and thereby heat the sample 50.

As noted above, the balance 10 is a conventional bottom-loading balance; however, it is modified in accordance with the present invention, such as by the addition of circuitry and electrodes to form the capacitor 90. Reference to the balance 10 herein shall be to the balance as so modified.

As shown in FIGS. 1, 4 and 5, the sample 50 is attached to a wire 130 or other support mechanism, which is in turn supported by the hand-down wire 20. The balance 10 includes a balance arm 140, from a first end 150 of which the wire 20 is attached, either directly as shown in FIG. 4 or by means of another attachment device such as a loop 160, as shown in FIG. 1.

The balance arm 140 has a second end 170. When the mass of a sample such as sample 50 is altered, the balance 10 detects a variation in the position of the end 170, such as by means of a photodiode array 135, in a standard manner. Other conventional position or motion detection means may be utilized, such as electrical or capacitive means. The balance 10 includes a means 180 for restoring the second end 170 to its original position when the mass of a sample (such as sample 50) is altered.

In the present invention, the actual mass of the sample 50 is not altered, but the apparent mass (i.e., the mass detected by the balance 10) is altered, due to the attractive force established between the sample 50 and the electrode 30 upon heating of the sample 50 and establishment of an electric field across the capacitor 90.

The furnace 40, the sample 50, the arm 140, the photodetector array 135, and the electrode 30 are preferably at least partially enclosed in a chamber 210 with seals 220 and 230 and means 240 and 250 for injecting and releasing nitrogen, respectively. The injecting means may include a source 255 of pressurized nitrogen, or may be a pump or some other means for providing a nitrogen environment. The nitrogen ($N_2$) is utilized to prevent the sample from oxidizing, combusting, or otherwise undergoing changes which may be undesirable.

It will be appreciated that other environments may be utilized that fulfill this function, such as helium or other inert gases. Alternatively, oxygen, hydrogen, carbon monoxide, carbon dioxide, or other oxidizing or reducing gases may be utilized, depending upon the desired application, since these gases may result in better detection of peroxies.

A conventional thermostatic control 260 is provided at the furnace 50, and is coupled to a controller 270 via controller connector 280. At the controller 270, the operator of the apparatus may choose the desired temperature range, and set the thermostatic control 260 to maintain a particular temperature. Typically, a sample will be tested at a variety of temperatures in a given run.

Once the sample 50 has been heated to the desired, predetermined temperature, a voltage is supplied by means of the power supply 200 to the electrode 30. The windings 80, which as indicated above act as a counter-electrode, are grounded, so that the total potential across the capacitor 90 is due to the power supply 200.

Applicants have learned that the surface charges on many types of minerals alter with both temperature and applied potential, and that this is an indication of the amount of peroxies, or impurities, within the sample. In the area of insulators or semiconductors, this provides an important method of detecting defects in the crystalline structure, such as in silica or silicon, since the defects may cause migration to the surface or subsurface of the sample of charge carriers. Thus, a measurement of the effect of applied temperature and external potential upon the sample 50 provides a measurement of the amount of impurities within the sample. Such effects are detected by measuring the apparent mass of the sample 50 by means of the balance 10.

As the sample 50 heats up, if peroxies or other impurities are present, they will migrate to the surface of the sample. This may result in either an initial positive charge at the surface (such as in the case of peroxies), or an initial negative charge. If the applied external voltage is positive and the surface/subsurface charge in the sample is also positive, there will be an electrostatic repulsion between the electrode 30 and the sample 50. However, as the potential is continually applied by the electrode 30, eventually there is a reorientation of the dipoles within the sample 50, with the result that there is an ultimately attractive force between the electrode 30 and the sample 50.

Both the attraction and the repulsion are reflected by the balance 10, because each results in an alteration in the position of the end 160 of the arm 140. The photodetector array 135 detects the change in position of the end 160, and the restoring means 180 restores the arm 140 to its initial position. The amount of force (or, alternatively, work) necessary to perform this restoring function is determined in a conventional fashion by an analyzer 290 which is coupled to both the array 135 and the restoring means 180, for reading the responses of the array 135 and for controlling the means 180. The analyzer has an output which is a correlation of the applied voltage with the restorative forces necessary to rebalance the arm 140, and thus the analyzer output reflects the amount of subsurface charges present in the sample 50.

The analyzer output is recorded by a conventional means for recording 300, which may be include a graph generator, an electronic memory, and other means of storing and displaying information.

Figure 7:
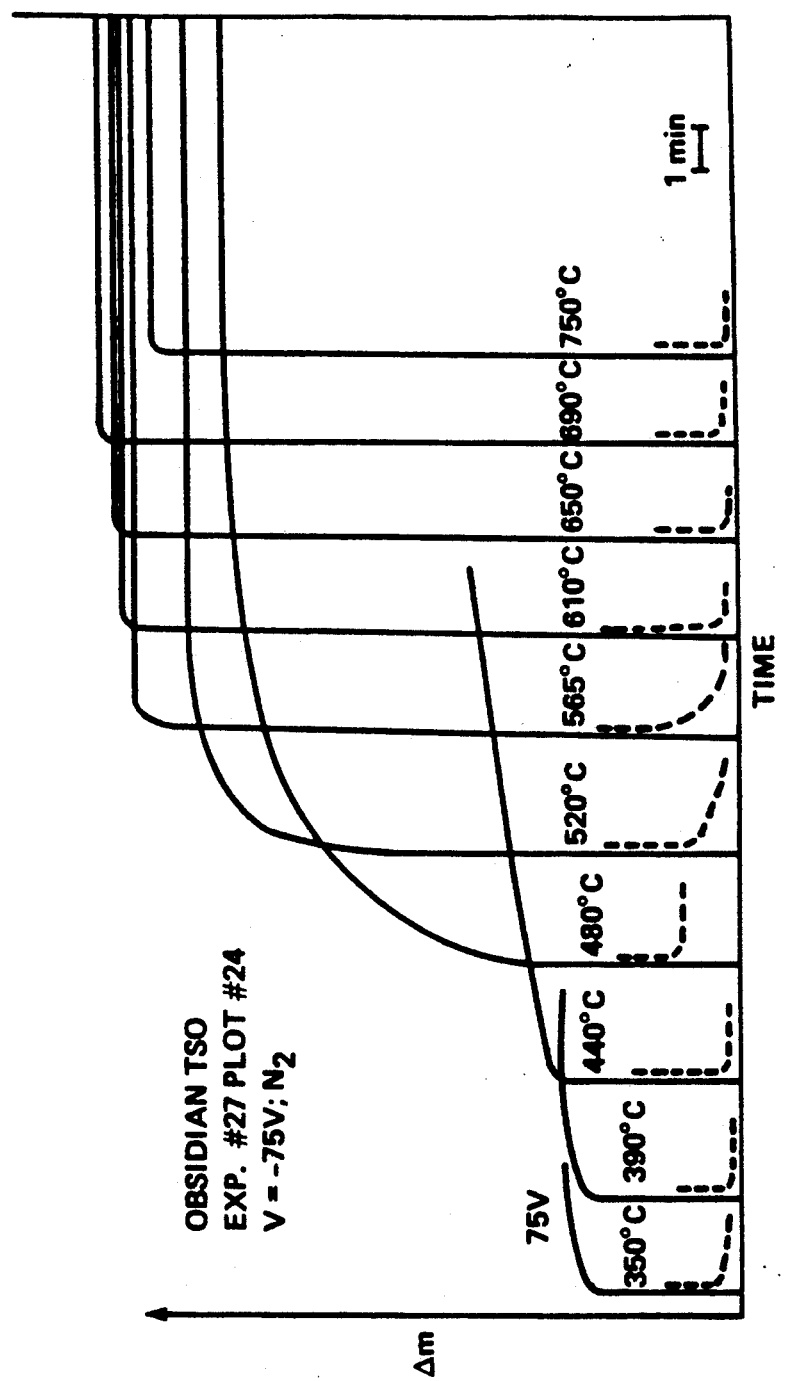
FIGS. 7-13 show various test results utilizing the method and apparatus of the present invention.

Typical results of the recorder 300 are as shown in FIGS. 2A-2C, discussed above. Additional results are shown in FIGS. 7-13, all of which relate to actual tests utilizing the method and apparatus of the present invention on obsidian. FIG. 7 represents the effective mass detected by the balance when obsidian has been heated to the various temperatures shown, and then an external voltage of 75 volts is applied. As indicated by that figure, at first when the voltage is applied, there is an initial attraction of the sample to the bias electrode (indicated by the rise in the effective mass, or delta-m), and then over time (note the 1-minute scale on the right), the attraction increases. This indicates attraction due to peroxies in the sample, and thus provides a measure of the amount of these peroxies. Note that as the temperature increases, the effect of the peroxies on the effective mass also increases.

Figure 8:
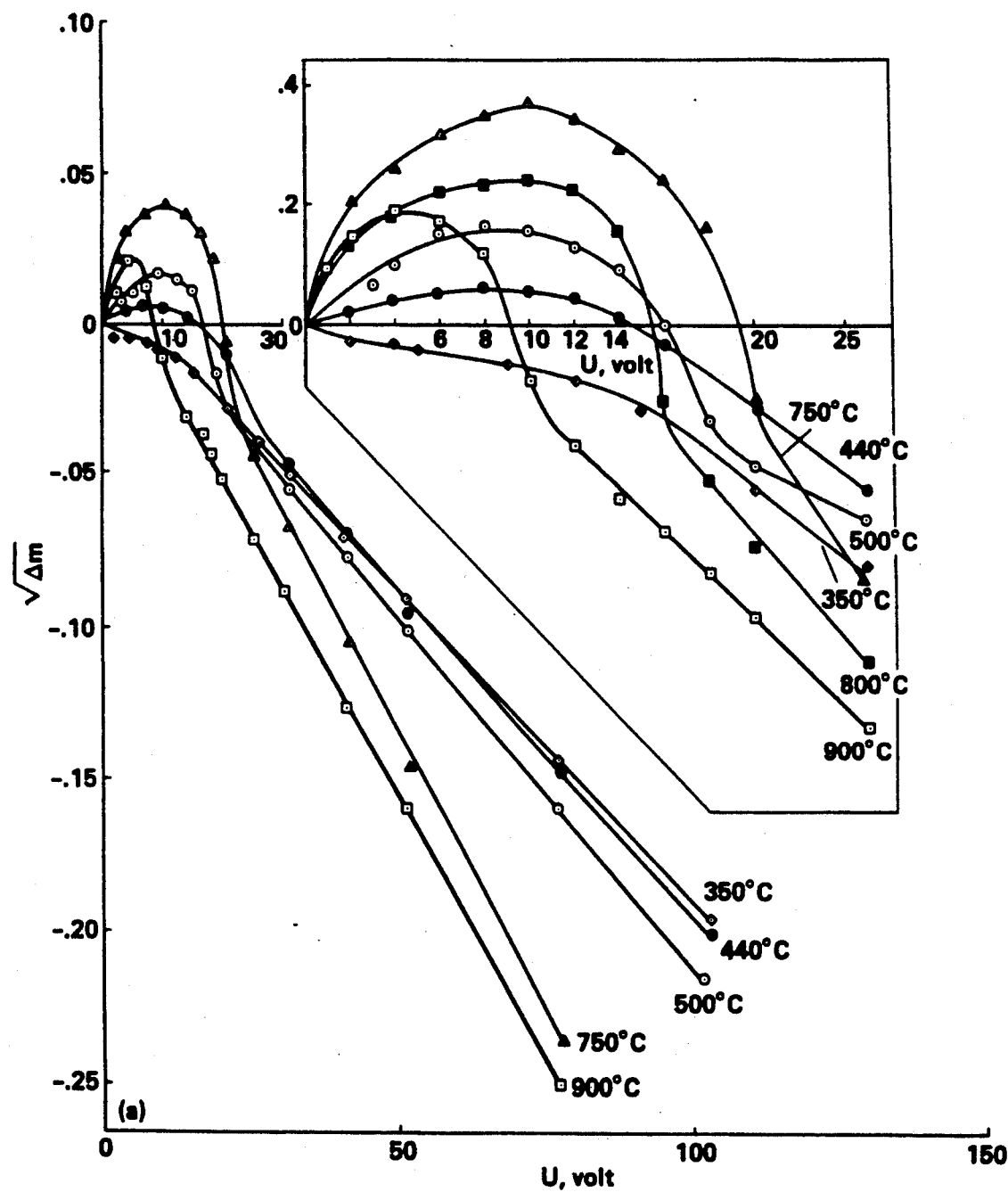

FIG. 8 shows the effect on a sample wherein there is initially a repulsion, which is due to the presence of positive subsurface charges. Past a certain applied voltage for each given temperature, the oriented dipoles cause electrostatic attraction with the bias electrode, and thus there is eventually a net attraction despite the presence of the peroxies causing a positive subsurface charge. The amount of the initial repulsive effect is a measure of the amount of peroxies. In the case of quality control for silica or other semiconductor products, this would be a measure of the amount of impurities within the product.

Figure 9:
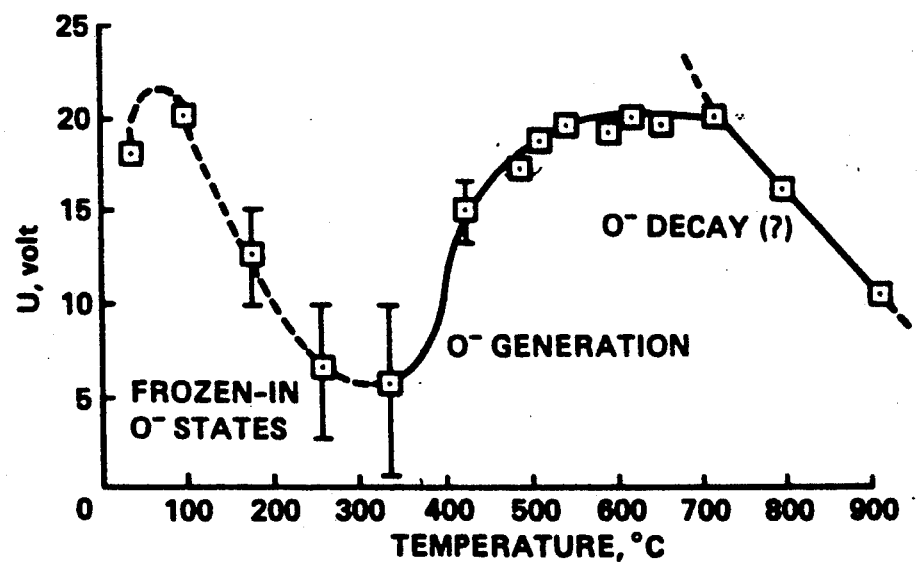

FIG. 9 shows, in the dotted-line graph, the response of a sample which has been treated by heating it up to a high temperature, such as between 300° and 700° C., and then rapidly cooling it, thereby "freezing in" the subsurface charges due to the peroxies. The solid-line portion of FIG. 9 shows the response of a sample where the subsurface charges have not been frozen in.

Figure 10:
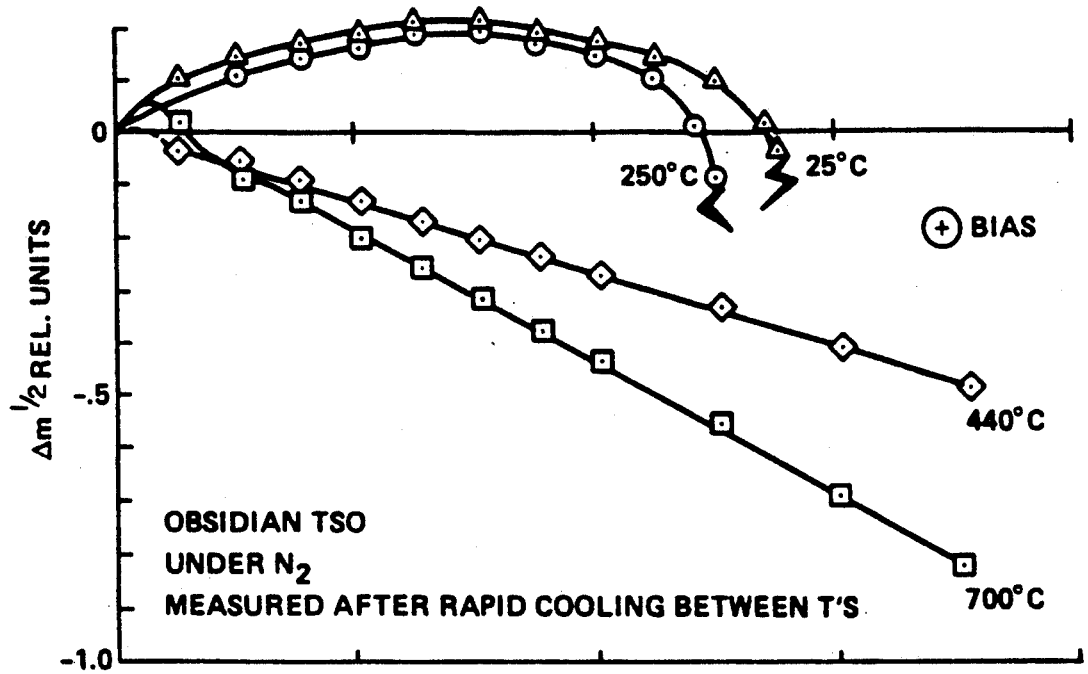
Figure 11:
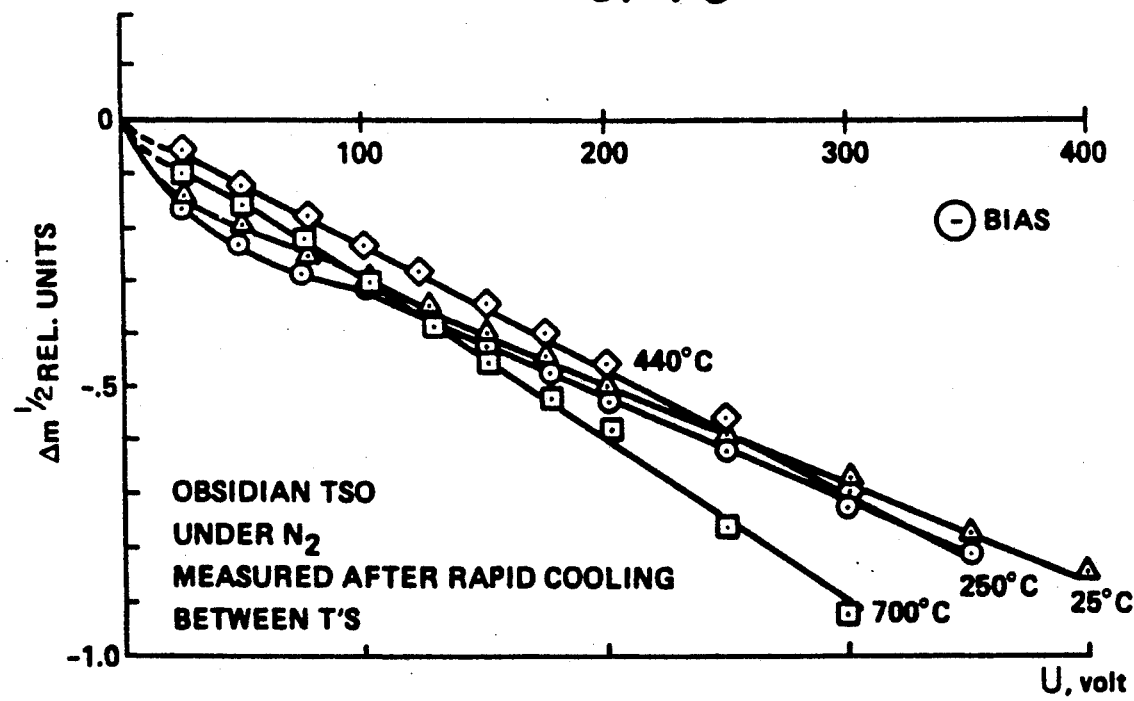

FIGS. 10 and 11 show the results of the method and apparatus of the invention wherein positive and negative external biasing potentials, respectively, are applied to a sample of obsidian wherein the subsurface charges have been frozen in, as described above.

Figure 12:
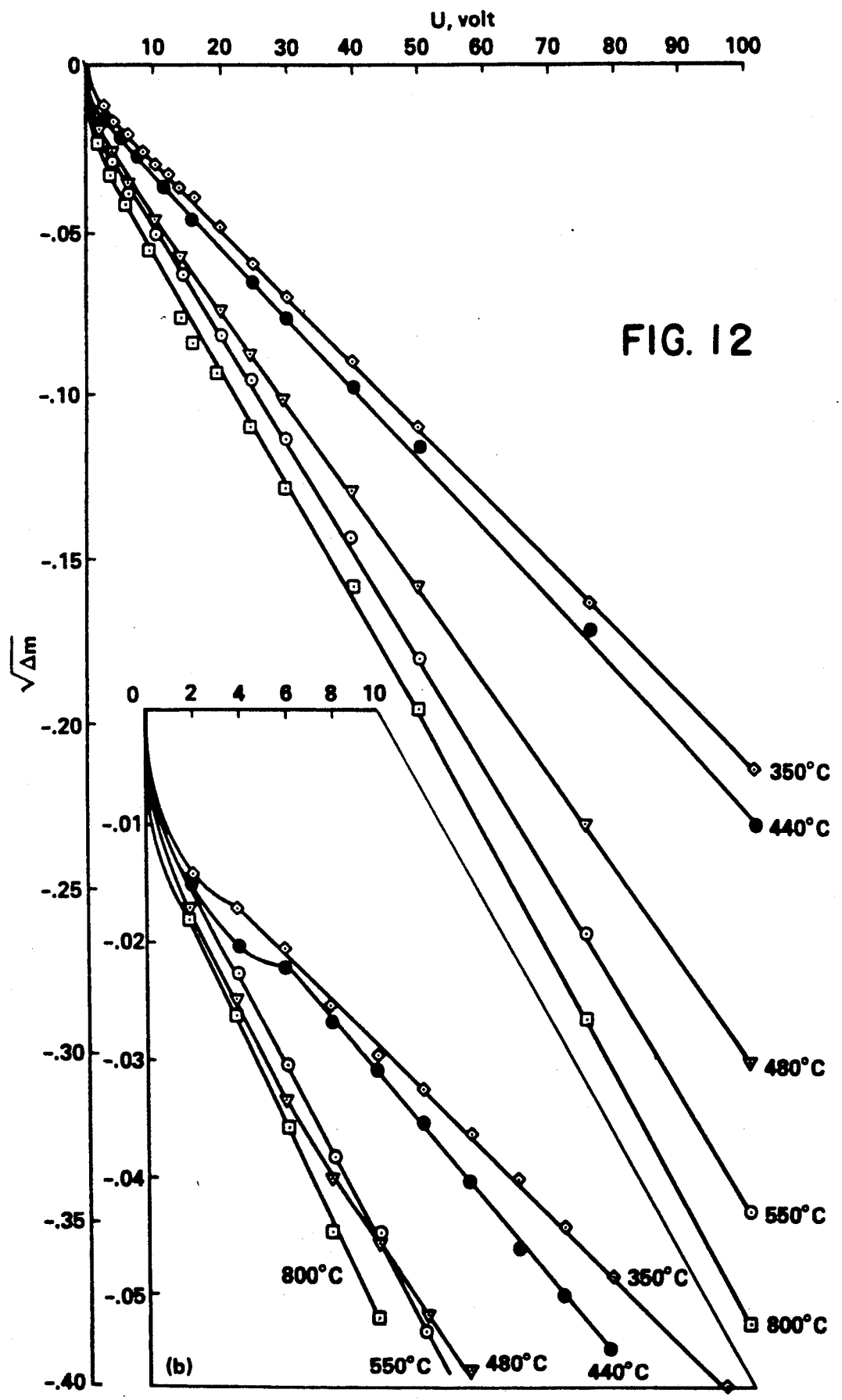

FIG. 12 shows a set of test results for obsidian at various applied voltages and again indicates the attraction due to the peroxies. The inset of FIG. 12 is an enlarged section near the origin of the graph. The results shown in FIG. 12 are analogous to those of FIG. 8, except that they reflect the use of a negative, instead of positive, applied potential.

Figure 13:
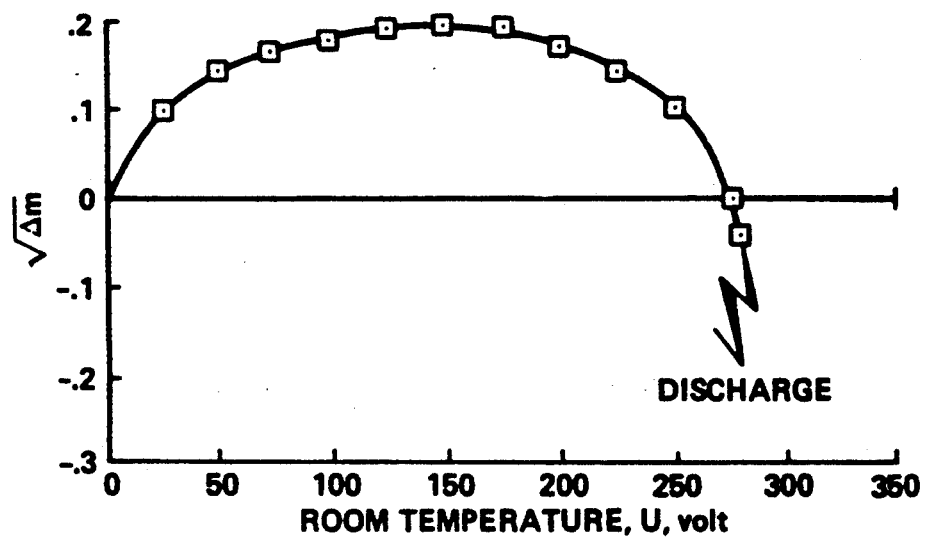

FIG. 13 shows the results of a test at room temperature for a sample of obsidian wherein the peroxy subsurface charges have been frozen in as described above. As indicated, past a certain voltage (here, about 275 V. applied external potential), there is a discharge between the sample and the windings of the furnace, i.e. the counterelectrode.

Figure 6:
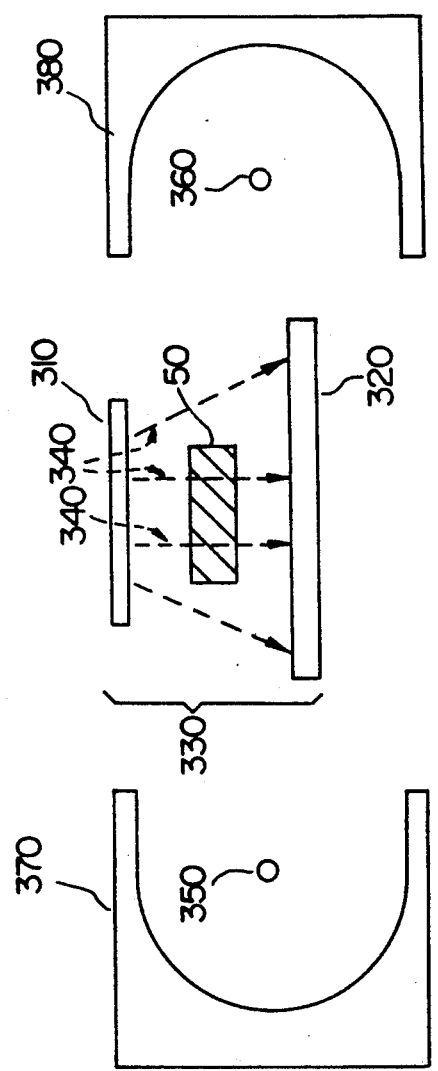
FIG. 6 shows a portion of an alternative embodiment of the present invention.

An alternative embodiment of the apparatus of the invention is shown in FIG. 6. In this embodiment, the sample 50 is heated by infrared radiation, rather than by convection and/or conduction heating, as with the first embodiment. A combination of these methods of heating the sample may also be utilized. In the embodiment of FIG. 6, a bias electrode 310 and a counterelectrode 320 are used, and the sample 50 is positioned therebetween, as with the embodiments of FIGS. 1, 4 and 5. However, in this embodiment, the counterelectrode 320 does not serve as a heater, and thus the configuration may be one of many different shapes, allowing for great latitude in determining the geometric configuration of the resulting capacitor 330. In FIG. 6, the counterelectrode 320 is chosen to be larger than the electrode 310, to ensure that the resulting electric field 340 is nonhomogeneous.

Infrared generators 350 and 360 are provided, and heat the sample 50 by radiative heating. Infrared reflectors 370 and 380 are provided, positioned near the generators 350 and 360, to maximize the effectiveness of the infrared generators.

The following variations may be made on the method and apparatus of the invention. The electrodes and the sample may be configured such that a significant portion of the electric field lines emanating from the bias electrode traverse the sample, and such that the average distance between the surface of the sample opposing the bias electrode and the grounded equipotential surface, called the counter gap, is larger than the gap between the bias electrode and the sample. The gap and the counter gap may be of various relative sizes.

In another embodiment, the bias electrode, instead of being of planar shape, may instead be of a generally nonplanar shape including but not limited to a wedge-like or needle-like shape or a 1-dimensional or 2-dimensional array of needle-like electrodes, each electrically insulated from all other electrodes with the provision to apply a bias voltage to each of them individually.

It is advantageous to minimize the linkage force between the bias electrode and the means for applying a potential thereto.

In one embodiment, the electrodes and the sample may be vertically oriented adjacent one another. In this and the other embodiments, grid may be inserted in the gap to be operated as a control electrode.

In another embodiment, a mechanical device is included which allows, when operated, to mechanically touch the sample in order to ground it or to charge it to a preselected positive or negative potential.

In another embodiment, radioactive source is included which allows, when brought into proximity of the sample, the electrical discharge of the sample by ionization.

In another embodiment, a cooling device is included which allows, when operated, to control the temperature of the sample to temperatures below ambient. The cooling device may be used in place of or in conjunction with the furnace.

In another embodiment, device may be added to expose the sample to electromagnetic radiation or electron or other particle bombardment.

The apparatus as discussed above is preferably contained in a gas-tight or vacuum-tight container.

In an alternative embodiment, secondary electrode may be added to the bias electrode to monitor the rise and fall of the bias. The bias potential may be increased or decreased or reversed in a step-wise time function, or in an oscillatory fashion.

In the above description, the forces $F_z^{\pm}$ were measured with a balance as a force measuring device, and the direction z was chosen to coincide with the direction of the gravitational vector g. However, the coincidence between the z and g vectors may introduce complications when the samples under study lose or gain mass during measurement. In such cases, the baseline under zero field shifts according to the rate of mass loss or gain. This introduces measuring errors. Applicants have now determined that the actual task of CDA, namely the measurement of surface charge layers and of the distribution of mobile charge carriers and their sign, can be performed without knowledge or measurement of concomitant mass gains or losses.

A substantial improvement of the technique was achieved by using as a force measuring device a vertical pendulum. With such an arrangement, the force $F_z^\pm$ which responds to changes in mass of the sample is directed parallel to the axis of the pendulum z which in turn is set up to be parallel to the gravitational vector g. Hence, under static or near-static conditions, the apparatus is indifferent to changes of the force $F_z^\pm$. On the other hand, two orthogonal directions remain in x and y which can be exploited to measure forces $F_{x,y}^\pm$ that are caused by the response of the sample to externally applied fields.

This introduces the possibility to combine measurements according to the above-described charge distribution analysis or CDA (which are carried out in an electric field gradient) with other measurements such as those of the magnetic susceptibility (which are carried out in a magnetic field gradient). If, for instance, an electric field gradient is set up along the x axis, a force $F_x^\pm$ will be generated in dielectric material which provides information about the dielectric constant of said material. If a magnetic field gradient is set up along the y axis, a force $F_y^\pm$ will be generated which provides information about the magnetic susceptibility of the same material.

FIGS. 14–17 show embodiments in which a sample 500 is supported on a platform 510, which is carried by a vertically-disposed support beam 520 mounted at 530 at an anchor point 530. The sample 510 is positioned relative to a bias electrode and a counter electrode as in the previous embodiments, such as FIGS. 4, 4A, 5 and 6, though these are not separately shown in FIGS. 14–17. The deflection detection system in each of FIGS. 14–17 is designated as 540.

FIGS. 14–17 show different possible configurations for the sample and platform, the anchor of the vertical pendulum, and the deflection detection system. In each configuration, as described above, changes in mass do not affect determination of the surface charges and other measurements and calculations made using the present invention.

Figure 14:
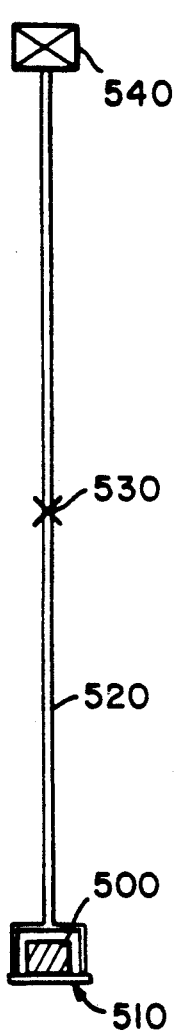
FIGS. 14-18 show alternative embodiments of the invention with a vertically-disposed beam.
Figure 15:
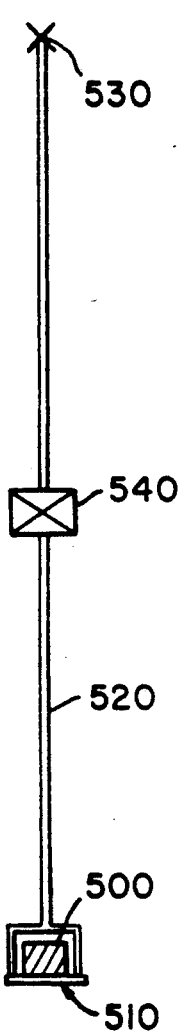

In FIGS. 14 and 15, the sample 500 is carried at the bottom of the pendulum or beam 520. In FIG. 14, the anchor 530 is somewhere along the middle of the beam 520 (most conveniently at the center), and the system 540 is at or near the top of the beam. In FIG. 15, the positions of the anchor and deflection detection system are reversed relative to FIG. 14. In both FIGS. 14 and 15, the sample is carried below the center of gravity of the beam-plus-sample system.

Figure 16:
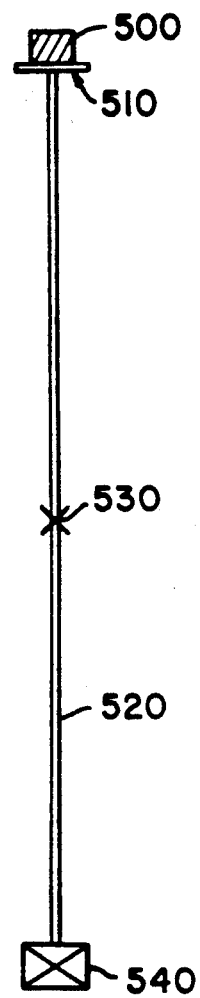
Figure 17:
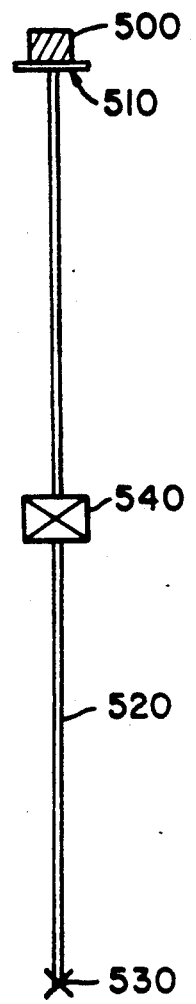

In FIGS. 16 and 17, the sample 500 is carried at the top of the beam 520. In FIG. 16, the anchor 530 is again at the center of the beam, or somewhere else along its length, while the system 540 is at or near the base of the beam 520. In FIG. 17, the positions of the anchor and the deflection detection system are reversed relative to their positions in FIG. 16. In both FIGS. 16 and 17, the sample is carried above the center of gravity of the beam-plus-sample system.

Figure 18:
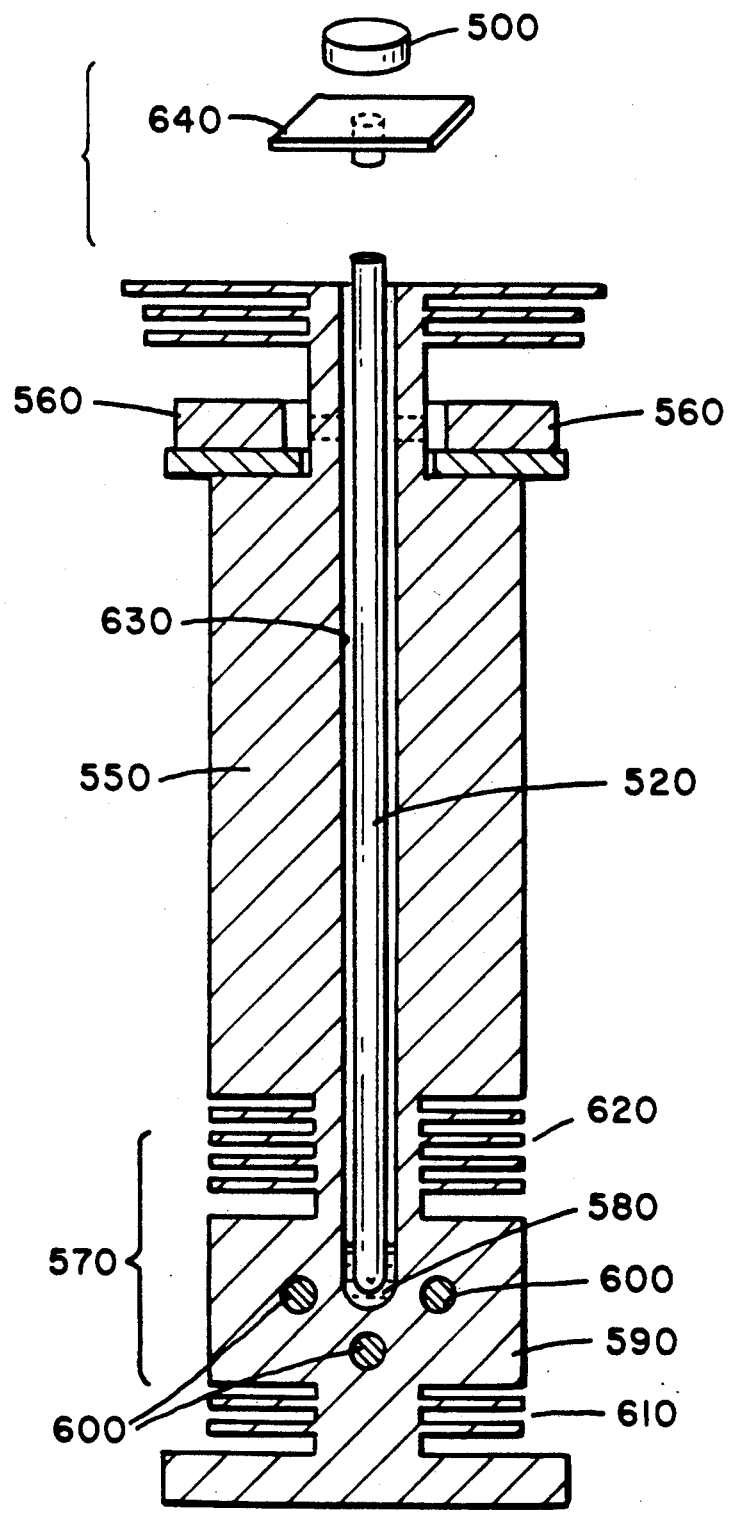

The configurations of FIGS. 16 and 17 have the distinct advantage that, not only is the effect of gravity compensated for by the vertical arrangement, but also, the sample platform 510 is easily accessible because of its placement on top of the support beam 520. FIG. 18 shows an embodiment corresponding to the configuration of FIG. 17, including an aluminum block 550, a position control and deflection detection device 560, and a support or anchor 570. The support 570 in the preferred embodiment includes a metal 580 with a low melting point, such as mercury or Wood's metal (which is an alloy including tin). A heating block 590 having heaters 600 is provided to keep the metal 580 in a liquid state, and is insulated from the table and the aluminum block 550 by thermal insulators 610 and 620, respectively.

The beam or rod 520 is positioned within a bore 630 in the block 550, and is thus in a metastable position. For minimizing the mass of the beam 520 in the embodiment of FIG. 18, the beam may be a hollow tube closed at its lower end. For instance, the beam 520 may be a thin-walled (4 mm) fused silica tube such as an EPR or NMR tube.

A sample support 640 is carried on top of the beam 520, and a sample 500 is placed on the support. When force is exerted on the sample as described above with respect to the earlier embodiments, the system 560 maintains the beam 520 in a vertical position, and the forces necessary to do so are utilized in the calculations described previously.

It will be understood that the embodiments described herein are merely illustrative, as there are many variations and modifications which may be made by those skilled in the art. Thus, the invention is to be construed as being limited only by the spirit and scope of the claims.

We claim:

1. A method for measuring a static dielectric constant of a material, including the steps of:
   (1) placing a sample of the material on a force-measuring device;
   (2) applying a nonhomogeneous electric field to a volume including the sample;
   (3) measuring a force upon the sample as a function of the applied electric field; and
   (4) deriving a value for the static dielectric constant of the material from the measured force.

2. A method for measuring a static dielectric constant of a material, including the steps of:
   (1) placing a sample of the material on a force-measuring device;
   (2) applying a nonhomogeneous electric field to a volume including the sample;
   (3) measuring a force upon the sample as a function of the applied electric field; and
   (4) deriving a value for the static dielectric constant of the material from the measured force by determining a slope of a curve of the square root of the measured force as a function of the applied voltage.

3. The method of claim 1, wherein step 3 is carried out by applying a potential across a capacitor which includes a dielectric.

4. The method of claim 1, including, before step 2, the step of adjusting the force to a predetermined setting, and wherein step 4 is carried out by readjusting the force-measuring device of the predetermined setting, and determining an amount of potential change across the capacitor required for such readjustment.

5. A method for measuring a static dielectric constant of a material, including the steps of:
   (1) placing a sample of the material on a force-measuring device;
   (2) applying a nonhomogeneous electric field to a volume including the sample;

(3) measuring a force upon the sample as a function of the applied electric field; and (4) deriving a value for the static dielectric constant of the material from the measured force, wherein the steps 2 and 3 are both carried out for at least two electric fields of opposite polarity, such that a plurality of forces ar measured, and step 4 includes the step of comparing the plurality of forces for invariance under change in polarity.

6. The method of claim 5, wherein step 3 is carried out by applying a potential across electrodes of a capacitor, and the electric fields are generated by applying positive and negative potentials across the electrodes.

* * * * *